United States Patent [19]
Tada et al.

[11] Patent Number: 5,760,666
[45] Date of Patent: Jun. 2, 1998

[54] DIELECTRIC RESONANT COMPONENT WITH RESIST FILM ON THE MOUNT SUBSTRATE

[75] Inventors: Hiroshi Tada; Hajime Suemasa; Haruo Matsumoto; Takashi Maruyama; Hideyuki Kato; Yasuo Yamada; Hirohumi Miyamoto; Hitoshi Tada, all of Kyoto, Japan

[73] Assignee: Murata Manufacturing Co., Ltd., Japan

[21] Appl. No.: 694,647

[22] Filed: Aug. 9, 1996

Related U.S. Application Data

[62] Division of Ser. No. 509,332, Jul. 31, 1995, Pat. No. 5,572,175, which is a continuation of Ser. No. 116,079, Sep. 2, 1993, abandoned.

[30] Foreign Application Priority Data

| Sep. 7, 1992 | [JP] | Japan | 4-069059 |
| Mar. 31, 1993 | [JP] | Japan | 5-098768 |

[51] Int. Cl.$^6$ .................................................. H01P 1/202
[52] U.S. Cl. ............................................. 333/206; 333/222
[58] Field of Search ............................... 333/202, 206, 333/207, 222, 223

[56] References Cited

U.S. PATENT DOCUMENTS

| 5,293,141 | 3/1994 | Kobayashi et al. | 333/206 |
| 5,402,090 | 3/1995 | Shimizu et al. | 333/206 |
| 5,506,554 | 4/1996 | Ala-Kojola | 333/206 |

FOREIGN PATENT DOCUMENTS

| 0552761 | 7/1993 | European Pat. Off. | |
| 178002 | 3/1989 | Japan | 333/202 DB |

*Primary Examiner*—Robert Pascal
*Assistant Examiner*—Justin P. Bettendorf
*Attorney, Agent, or Firm*—Ostrolenk, Faber, Gerb & Soffen, LLP

[57] ABSTRACT

A dielectric resonant component includes at least one dielectric multistage resonator including one dielectric block, a plurality of inner conductor formation holes formed in the one dielectric block, an inner conductor formed on an inner surface of each of the inner conductor formation holes, and an outer conductor covering a substantially entire outer surface of the one dielectric block, the dielectric multistage resonator constituting a plurality of dielectric resonators in the one dielectric block; and a mount substrate fixedly mounted on the dielectric multistage resonator, for transmitting a signal transmission between each of the dielectric resonators of the dielectric multistage resonator and an external circuit board, when the dielectric resonant component is mounted on the external circuit board. The dielectric multistage resonator further includes a pair of input/output electrodes, and the mount substrate includes a unit for connecting the input/output electrodes of the dielectric multistage resonator to a pair of input/output electrodes formed on the circuit board.

22 Claims, 11 Drawing Sheets

FIG. 21
PRIOR ART

DIELECTRIC RESONANT COMPONENT WITH RESIST FILM ON THE MOUNT SUBSTRATE

This is a division of application Ser. No. 08/509,332, filed Jul. 31, 1995, now U.S. Pat. No. 5,572,175, which is a continuation of Ser. No. 08/116,079, filed Sep. 2, 1993, abandoned.

BACKGROUND OF THE INVENTION

1. Field of the Invention

The present invention relates to a dielectric resonant component, and more particularly to a dielectric resonant component in which a plurality of dielectric resonators are formed in a single dielectric block.

2. Description of the Related Art

Figure 21:
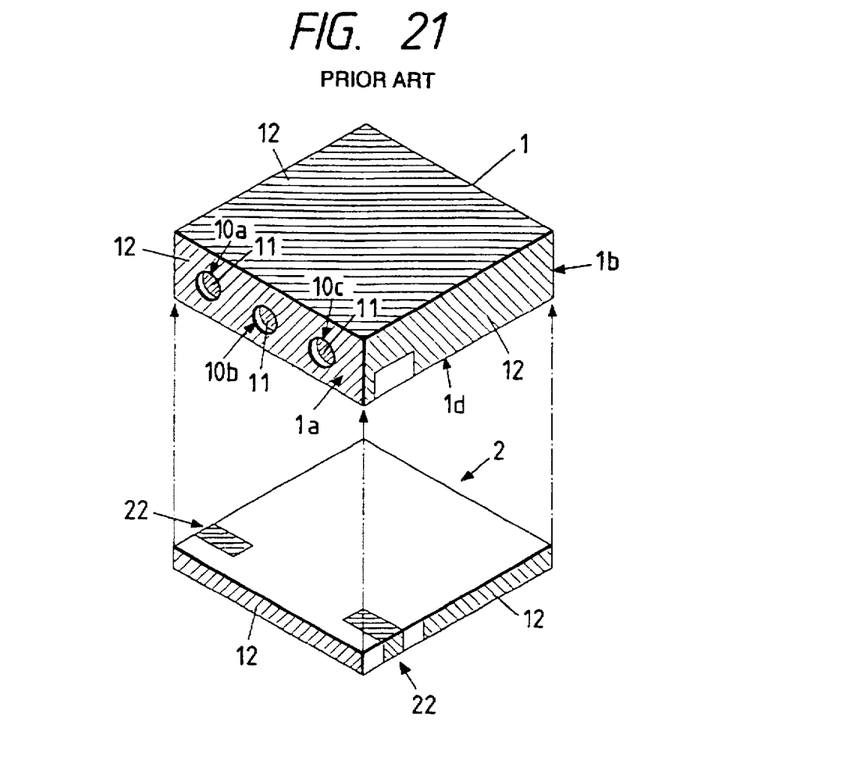
FIG. 21 is an exploded perspective view showing the configuration of a conventional dielectric resonant component.

FIG. 21 is an exploded perspective view showing the configuration of a conventional dielectric multistage resonator used in, for example, an automobile telephone or a portable telephone. In FIG. 21, three inner conductor formation holes 10a to 10c are formed between a first surface 1a and a second surface 1b of a dielectric block 1 made of ceramics or the like, in such a manner that the holes 10a to 10c pass through the dielectric block 1. On the inner surface of each of the inner conductor formation holes 10a to 10c, an inner conductor 11 is formed. A dielectric substrate 2 made of ceramics or the like is mounted on and fixed to the lower surface 1d of the dielectric block 1. After the dielectric substrate 2 is mounted on and fixed to the dielectric block 1, an outer conductor 12 is formed so as to cover the outer surface of the dielectric block 1 and that of the dielectric substrate 2. The outer conductor 12 is grounded. The inner conductor 11 in each of the inner conductor formation holes 10a to 10c has one end, which is open with respect to (or isolated from) the outer conductor 12 formed on the first surface 1a of the dielectric block 1, and the other end thereof is short-circuited to the outer conductor 12 formed on the second surface 1b of the dielectric block 1. On the right and left side surfaces of the dielectric substrate 2, a pair of input/output electrodes 22 are formed. Each of the input/output electrodes 22 extends onto the upper and lower surfaces of the dielectric substrate 2.

The above-mentioned conventional dielectric multistage resonator includes three dielectric coaxial resonators in a single dielectric block. By appropriately changing the coupling relationship between these dielectric coaxial resonators by means of external coupling elements (capacitors, coils, or the like), a high-frequency device such as a filter (a BEF, a BPF, an LPF, an HPF, or a polar BPF) is constructed.

As described above, a conventional dielectric multistage resonator is constructed by mounting the dielectric substrate 2 on the dielectric block 1. However, it is difficult to securely adhere the dielectrics together due to technical limitations, so that the outer conductor 12 easily cracks at the junction between the dielectric block 1 and the dielectric substrate 2. As a result, Q decreases. When cracks are caused in the outer conductor 12 on the second surface 1b of the dielectric block 1, Q significantly decreases.

In addition, between the dielectric block 1 and the dielectric substrate 2, no electrode is formed except for at the portions of the input/output electrodes 22. Accordingly, if the input/output electrodes 22 have various thicknesses, the gap between the dielectric block 1 and the dielectric substrate 2 may vary. This produces a problem in that the characteristics of the dielectric resonant component are greatly affected.

Furthermore, in a conventional dielectric multistage resonator, the size of the dielectric block 1 varies depending on the type of a product to which the resonator is applied, so that the interval between the input/output electrodes 22 is changed in accordance with the type of the product. Therefore, it is necessary for a user to change the design of a circuit board depending on the type of the dielectric multistage resonator to be employed. This is very troublesome and creates a problem.

Moreover, the coupling relationship between the dielectric resonators is conventionally changed by coupling elements which are disposed outside the dielectric multistage resonator, thereby causing the size and cost of the resonator to be increased.

SUMMARY OF THE INVENTION

Therefore, it is an object of the invention to provide a dielectric resonant component having excellent characteristics and high reliability.

It is another object of the invention to provide a dielectric resonant component which can be mounted on a circuit board even when the interval of the input/output electrodes of the dielectric multistage resonator is different from that of the input/output electrodes of the circuit board.

It is a further object of the invention to provide a dielectric resonant component which is miniaturized and has high functionality.

The objects of the present invention have been achieved by the provision of a dielectric resonant component, which comprises:

a dielectric multistage resonator which has a plurality of dielectric resonators formed in one dielectric block and in which a plurality of inner conductor formation holes are formed in the dielectric block, an inner conductor is formed on an inner surface of each of the inner conductor formation holes, and an outer conductor is formed to substantially cover an entire outer surface of the dielectric block; and a mount substrate, mounted on and fixed to the dielectric multistage resonator, for transmitting a signal transmission between each of the dielectric resonators of the dielectric multistage resonator and an external circuit board.

Also, in the resonator of the present invention, input/output electrodes are formed on the dielectric multistage resonator and the circuit board such that an interval of the input/output electrodes formed on the dielectric multistage resonator is different from that of the input/output electrodes formed on the circuit board, and the mount substrate connects the input/output electrodes on the dielectric multistage resonator to the input/output electrodes on the circuit board.

Further, in the resonator of the present invention, the mount substrate includes coupling circuit means for coupling the dielectric resonators of the dielectric multistage resonator in a predetermined manner.

Still further, in the resonator of the present invention, the mount substrate is mounted on and fixed to a step portion formed on the dielectric block.

Still further, in the resonator of the present invention, one mount substrate is commonly mounted on and fixed to a plurality of dielectric multistage resonators which are juxtaposed.

According to the present invention, the mount substrate which is mounted on and fixed to the dielectric multistage resonator transmits a signal transmission between each of the dielectric resonators of the dielectric multistage resonator and an external circuit board, and does not constitute part of the dielectric multistage resonator, unlike a dielectric substrate used in a conventional dielectric resonant component. Accordingly, in the invention, only the outer surface of the dielectric block is covered with the outer conductor, and the outer conductor is not formed on the mount substrate. Therefore, according to the invention, there is no possibility that a crack occurs in the outer conductor at the junction of the dielectric block and the mount substrate as in the conventional example. As a result, the characteristics are stabilized and the reliability is enhanced. In addition, the mount substrate does not constitute part of the dielectric multistage resonator as described above, so that any variation in the gap between the dielectric multistage resonator and the mount substrate does not affect the characteristics. Therefore, excellent characteristics are always obtained. Moreover, on the surface of the dielectric block to which the mount substrate is mounted, the outer conductor is formed. Accordingly, if the dielectric block is adhered to the mount substrate by utilizing the outer conductor, the strength of adhesive forces between them can be enhanced.

Also, according to the present invention, the input/output electrodes on the dielectric multistage resonator are connected by the mount substrate to the input/output electrodes on the circuit board which are arranged at an interval different from that of the input/output electrodes on the dielectric multistage resonator.

Further, according to the present invention, the dielectric resonators of the dielectric multistage resonator are coupled to each other on the mount substrate in a predetermined manner, whereby a dielectric resonant component with high functionality can be realized.

Still further, according to the present invention, the mount substrate is mounted on and fixed to a step portion formed on the dielectric block, whereby the size can be reduced.

Still further, according to the present invention, a plurality of dielectric multistage resonators are mounted on a single mount substrate, whereby a dielectric resonant component with higher functionality can be obtained.

DETAILED DESCRIPTION OF THE PREFERRED EMBODIMENTS

Embodiments of the present invention will be described with reference to the accompanying drawings.

Figure 1:
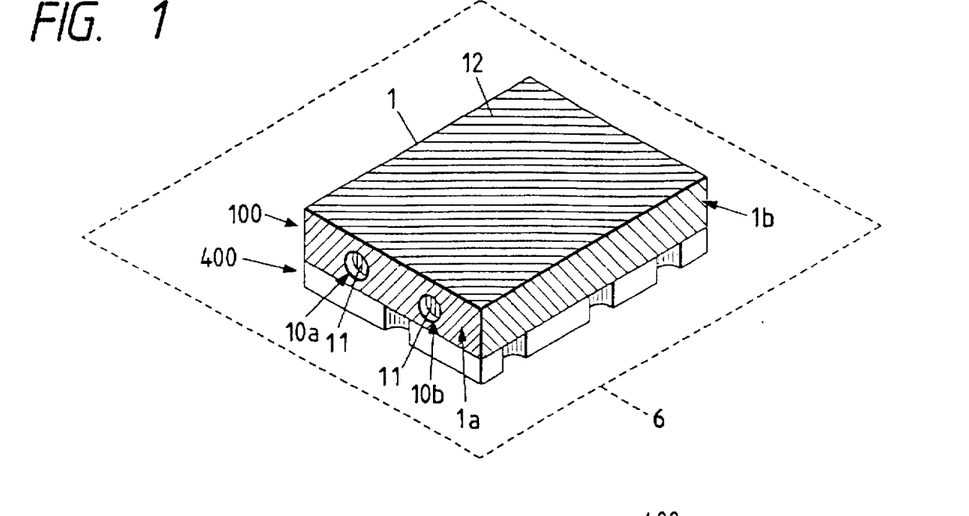
FIG. 1 is an outside perspective view showing the configuration of a dielectric resonant component according to a first embodiment of the invention.

FIG. 1 is a perspective view showing the configuration of a dielectric resonant component according to a first embodiment of the invention. In FIG. 1, the dielectric resonant component of the embodiment comprises a dielectric multistage resonator 100 and a mount substrate 400 on which the dielectric multistage resonator 100 is fixedly mounted. The dielectric multistage resonator 100 includes a dielectric block 1 which has a substantially parallelepiped form. Two inner conductor formation holes 10a and 10b passing through the dielectric block 1 are formed between a first surface 1a and a second surface 1b of the dielectric block 1. On the inner surface of each of the inner conductor formation holes 10a and 10b, an inner conductor 11 is formed. An outer conductor 12 is formed so as to substantially cover the entire six surfaces of the dielectric block 1. One end of the inner conductor 11 in each of the inner conductor formation holes 10a and 10b is open with respect to (or isolated from) the outer conductor 12 formed on the first surface 1a of the dielectric block 1, and the other end thereof is short-circuited to the outer conductor 12 formed on the second surface 1b of the dielectric block 1. Input/output electrodes (not shown) are formed on the lower surface of the dielectric block 1 in such a manner that they are electrically isolated from the outer conductor 12.

On the lower surface of the dielectric multistage resonator 100, the mount substrate 400 is fixedly attached. The dielectric multistage resonator 100 is surface-mounted on a circuit board 6 via the mount substrate 400. In the embodiment, the mount substrate 400 connects the input/output electrodes on the dielectric multistage resonator 100 to respective input/output electrodes on the circuit board 6 which are arranged at an interval different from that of the input/output electrodes on the dielectric multistage resonator 100. Various electronic circuit components for performing predetermined operations in cooperation with the dielectric resonant component are mounted on the circuit board 6.

Figure 2A:
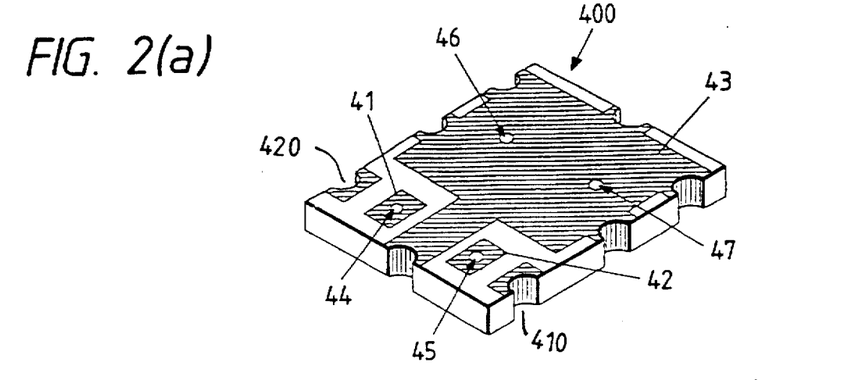
FIGS. 2(a) and 2(b) are outside perspective views showing upper and lower surfaces of a mount substrate shown in FIG. 1, respectively.
Figure 2B:
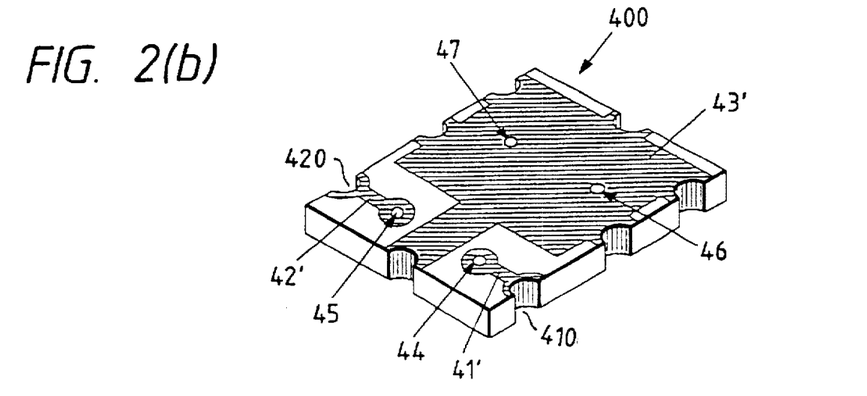

Each of FIGS. 2(a) and 2(b) is an outside perspective view showing the configuration of the mount substrate 400 shown in FIG. 1, respectively. Specifically, FIG. 2(a) shows the configuration of the upper surface on which the dielectric multistage resonator 100 is mounted, and FIG. 2(b) shows the configuration of the lower surface which is surface-mounted on the circuit board 6. In FIG. 2, the mount substrate 400 is made of a low-dielectric constant material (εr≦10) such as alumina, ceramics, resin, vectra, or glass. Electrodes made of, for example, a thick copper film are formed on the surfaces of the mount substrate 400. That is, as shown in FIG. 2(a), connecting electrodes 41 and 42 and a grounding electrode 43 are formed on the upper surface of the mount substrate 400. On the other hand, as shown in FIG. 2(b), input/output electrodes 41' and 42' and a grounding electrode 43' are formed on the lower surface of the mount substrate 400. The input/output electrodes 41' and 42' are connected to the connecting electrodes 41 and 42 on the upper surface via through holes 44 and 45, respectively. The input/output electrodes 41' and 42' extend onto recesses 410 and 420 the left and right side surfaces of the mount substrate 400, respectively. The input/output electrodes 41' and 42' are located only within the recesses 410 and 420 and do not extend onto the outer periphery of side surfaces of the mount substrate 400. The grounding electrode 43' on the lower surface is connected to the grounding electrode 43 on the upper surface via through holes 46 and 47, and by way of the side surfaces of the mount substrate 400.

While directing the upper surface of the mount substrate 400 upward, the mount substrate 400 thus formed is mounted on and fixed to the lower surface of the dielectric multistage resonator 100. The fixing of the mount substrate 400 onto the dielectric multistage resonator 100 is performed by appropriate means, for example, by conducting reflow-soldering, using a conductive adhesive, or baking with silver paste. In the case where the fixing is performed by soldering, when a thermal shock is applied, distortion occurs due to the difference in expansion coefficient between the electrodes, whereby the junction intersurface may be broken. In the case where the mounting is performed by using conductive paste, the strength of adhesive bonding of the conductive paste material is not always sufficient, resulting in a possibility that the junction intersurface may easily be broken by an external force. Accordingly, silver solder may be applied between the dielectric multistage resonator 100 and the mount substrate 400, and they are bonded at a high temperature (silver solder usually melts at temperatures between 640° and 800° C.). Since the difference in that expansion coefficient between the silver solder and the electrodes is small, distortion caused by a thermal shock is reduced. In addition, silver solder has a large strength of adhesive bonding and an excellent shock-resistance. Moreover, in the case where silver solder is used, the conductivity is improved as compared with the case of soldering. When the mount substrate 400 is mounted on and fixed to the dielectric multistage resonator 100, the connecting electrodes 41 and 42 on the upper surface of the mount substrate 400 contact with the input/output electrodes (not shown) formed on the lower surface of the dielectric multistage resonator 100, respectively. The grounding electrode 43 on the upper surface of the mount substrate 400 contacts the outer conductor 12 on the lower surface of the multistage resonator 100.

The dielectric multistage resonator 100 to which the mount substrate 400 is mounted and fixed as described above is surface-mounted on the circuit board 6 in such a manner that the mount substrate 400 is placed under the resonator 100. Since the input/output electrodes 41' and 42' are formed so as to extend onto the left and right side surfaces of the mount substrate 400, the input/output electrodes 41' and 42' can surely be connected to the input/output electrodes on the circuit board 6 even if the interval of the input/output electrodes on the circuit board 6 is larger than that of the input/output electrodes on the dielectric multistage resonator 100. Since the input/output electrodes 41' and 42' are connected to the input/output electrodes of the dielectric multistage resonator 100 via the connecting electrodes 41 and 42, the input/output electrodes on the dielectric multistage resonator 100 are connected to the input/output electrodes on the circuit board 6. In other words, the interval of the input/output electrodes on the dielectric multistage resonator 100 is widened by the mount substrate 400 so as to substantially match with the interval of the input/output electrodes on the circuit board 6.

In the embodiment shown in FIGS. 1, 2(a) and 2(b), the outer surface of the dielectric block 1 is covered with the outer conductor 12, but the mount substrate 400 is not provided with an outer conductor. Unlike a prior art device, therefore, there is no possibility that a crack occurs in the outer conductor 12 at the junction between the dielectric multistage resonator 100 and the mount substrate 400. In the resonator of the embodiment, accordingly, excellent characteristics can always be maintained, and the reliability can be improved. In the embodiment, the mount substrate 400 does not constitute part of the dielectric multistage resonator 100. Even if the gap between the dielectric multistage resonator 100 and the mount substrate 400 varies in size, the characteristics are not affected, to that a dielectric resonant component with excellent characteristics can always be obtained.

Figure 3A:
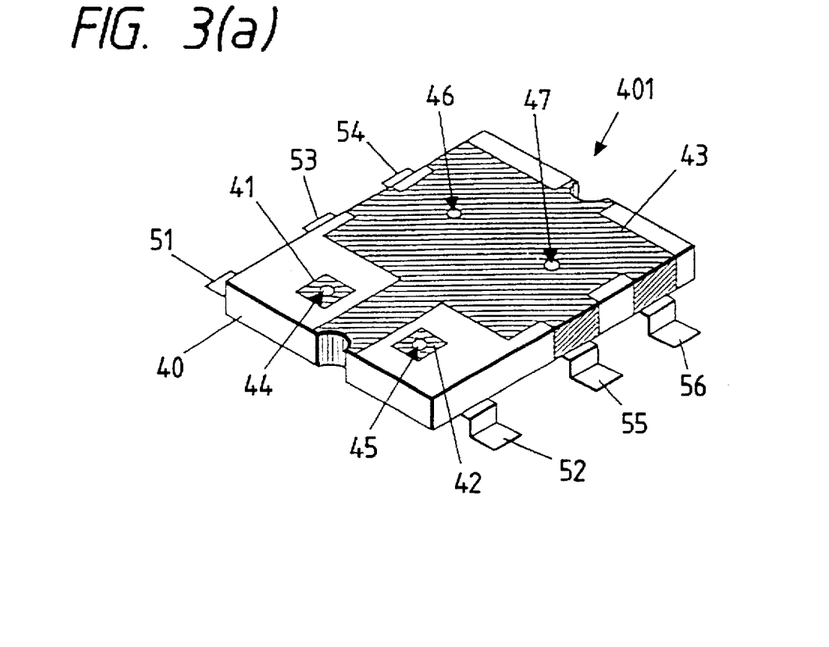
FIGS. 3(a) and 3(b) are outside perspective views showing upper and lower surfaces of another mount substrate, respectively.
Figure 3B:
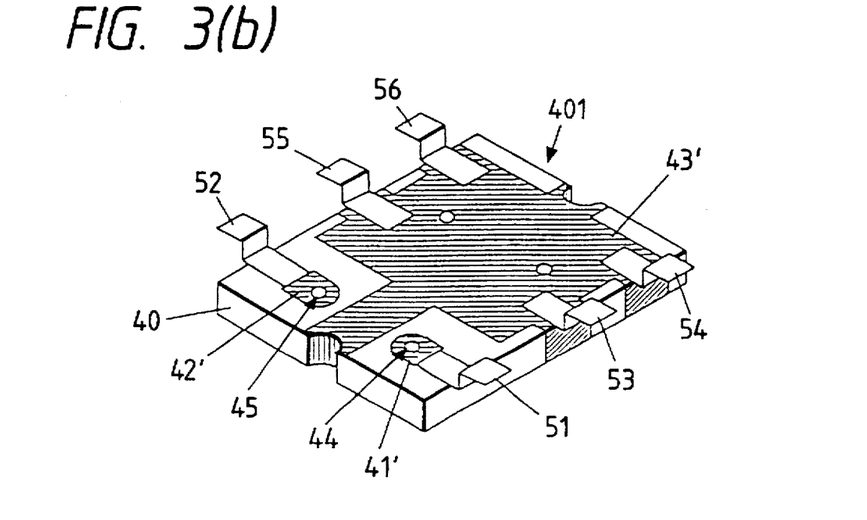

Each of FIGS. 3(a) and 3(b) is an outside perspective view showing the configuration of another mount substrate, respectively, wherein FIG. 3(a) shows the configuration of the upper surface of the mount substrate, whereas FIG. 3(b) shows the configuration of the lower surface of the mount substrate. As shown in FIG. 3(b), connecting terminals 51 and 52, and grounding terminals 53 to 56 are attached to the lower surface of the mount substrate 401. These terminals 51 to 56 are made of a conductive material such as a metal, and bent so as to have a stepped shape. The connecting terminals 51 and 52 are connected and fixed to the input/output electrodes 41' and 42', respectively. The grounding terminals 53 to 56 are connected and fixed to the grounding electrode 43'. The fixing of the terminals 51 to 56 to the mount substrate 401 is performed by soldering, molding or the like. The lower surface of each of the terminals 51 to 56 is connected and fixed to the circuit board 6, whereby the mount substrate 401 is surface-mounted on the circuit board 6. The other configurational points of the mount substrate 401 are the same as those of the mount substrate 400 shown in FIGS. 2(a) and 2(b). Corresponding elements are designated by like reference numerals, and their description is omitted.

The mount substrates 400 and 401 shown in FIGS. 2(a), 2(b), 3(a) and 3(b) are constructed so as to substantially widen the interval of the input/output electrodes on the dielectric multistage resonator 100. In a reverse manner, they may be constructed so as to substantially narrow the interval of the input/output electrodes on the dielectric multistage resonator 100. In the mount substrate, therefore, the shape and length of the connecting electrodes 41 and 42 and those of the input/output electrodes 41' and 42' can be adequately determined depending on the design of the dielectric resonant component and the circuit board.

The mount substrates 400 and 401 connect the input/output electrodes on the dielectric multistage resonator to the respective input/output electrodes on the circuit board which are arranged at an interval different from that of the input/output electrodes on the dielectric multistage resonator. The mount substrate may also couple the dielectric resonators of the dielectric multistage resonator in a desired manner. Hereinafter, embodiments provided with a mount substrate having such a coupling function will be described.

Figure 4:
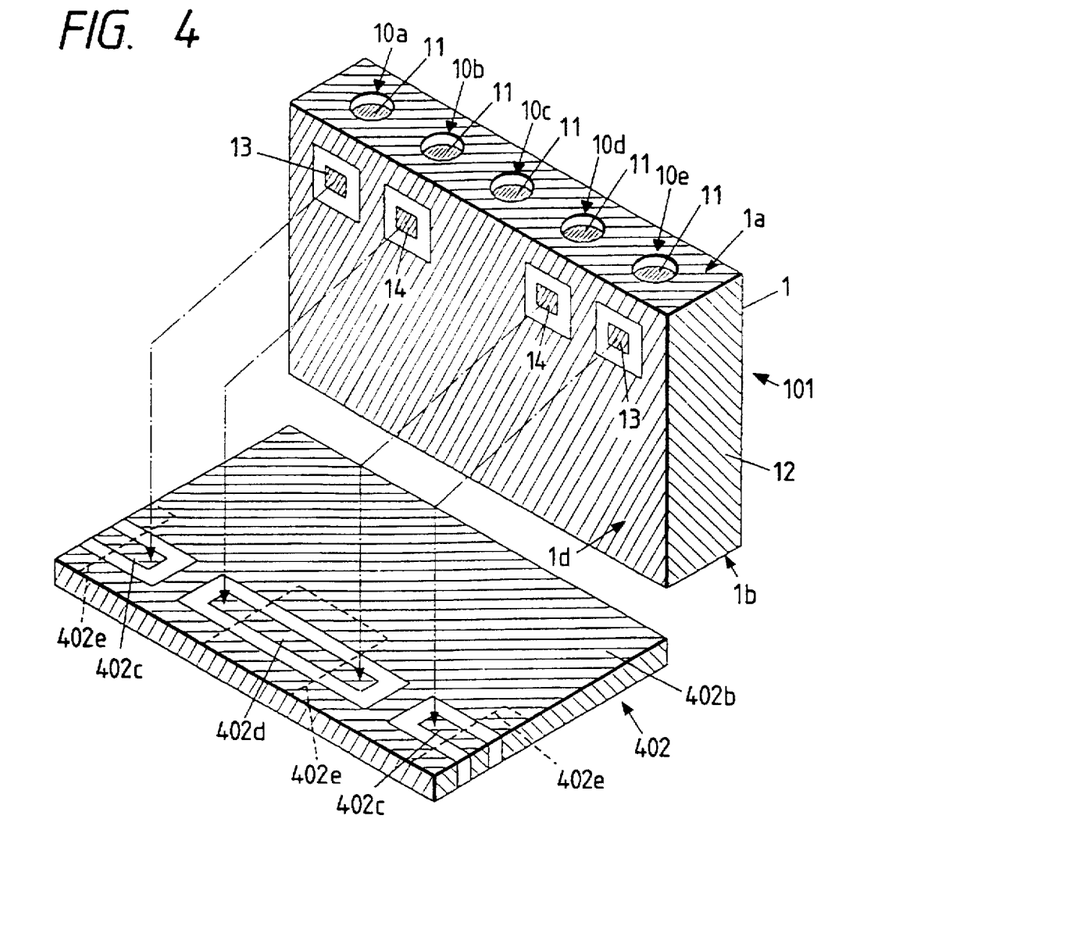
FIG. 4 is an exploded perspective view showing the configuration of a dielectric resonant component according to a second embodiment of the invention.

FIG. 4 is an exploded perspective view showing the configuration of a dielectric resonant component according to a second embodiment of the invention. In FIG. 4, the dielectric resonant component of the embodiment comprises a dielectric multistage resonator 101 and a mount substrate 402 on which the dielectric multistage resonator 101 is mounted. The dielectric multistage resonator 101 includes a dielectric block 1. Five inner conductor formation holes 10a to 10e passing through the dielectric block 1 are formed between a first surface 1a and a second surface 1b of the dielectric block 1. On the inner surface of each of the inner conductor formation holes 10a to 10e, an inner conductor 11 is formed. An outer conductor 12 is formed so as to cover the substantially entire outer surface of the dielectric block 1. The inner conductor 11 in each of the inner conductor formation holes 10a–10e has one end thereof which is open with respect to (or isolated from) the outer conductor 12 formed on the first surface 1a of the dielectric block 1, and the other end which is short-circuited to the outer conductor 12 formed on the second surface 1b of the dielectric block 1. On the lower surface 1d of the dielectric block 1, a pair of input/output electrodes 13 and a pair of signal extracting electrodes 14 are formed in such a manner that they are isolated from the outer conductor 12. Between the input/output electrodes 13 and the signal extracting electrodes 14, and the inner conductors 11 in the corresponding inner conductor formation holes, external coupling capacitances (Ce in FIG. 5) are produced.

On the other hand, the mount substrate 402 is made of a low-dielectric constant material such as alumina, ceramics, resin, vectra, or glass, in the same manner as the mount substrates 400 and 401. A grounding electrode 402b, a pair of input/output electrodes 402c, and a bypass electrode 402d are formed on the mount substrate 402. The mount substrate 402 is mounted on and fixed to the lower surface 1d of the dielectric multistage resonator 101. As a result, the input/output electrodes 13 are connected to the input/output electrodes 402c, the signal extracting electrodes 14 are connected to the bypass electrode 402d, and the outer conductor 12 is connected to the grounding electrode 402b. At predetermined positions on the upper surface of the mount substrate 402, resist films 402e are formed. The resist films 402e are arranged to prevent the input/output electrodes 402c and the bypass electrode 402d from being short-circuited to the outer conductor 12. The dielectric multistage resonator 101 is surface-mounted on a circuit board which is not shown, via the mount substrate 402.

Figure 5:
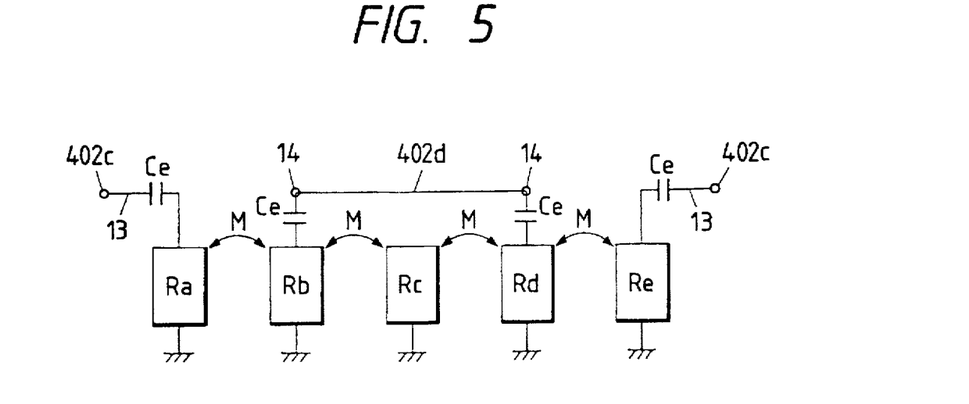
FIG. 5 is an equivalent circuit diagram of the dielectric resonant component shown in FIG. 4.

FIG. 5 is an equivalent circuit diagram of the dielectric resonant component shown in FIG. 4. In FIG. 5, dielectric resonators Ra to Re correspond to the dielectric resonators formed in the periphery of the inner conductor formation holes 10a to 10e, respectively. The respective adjacent ones of the dielectric resonators Ra to Re are inductively coupled to each other. The dielectric resonators Ra and Re and the input/output electrodes 13, and the dielectric resonators Rb and Rd and the signal extracting electrodes 14 are coupled by the above-mentioned external coupling capacitances Ce, respectively. The signal extracting electrodes 14 are bypassed by the bypass electrode 402d. The dielectric resonant component shown in FIG. 4 and having such an electric configuration functions as a polar BPF (band pass filter).

Figure 6:
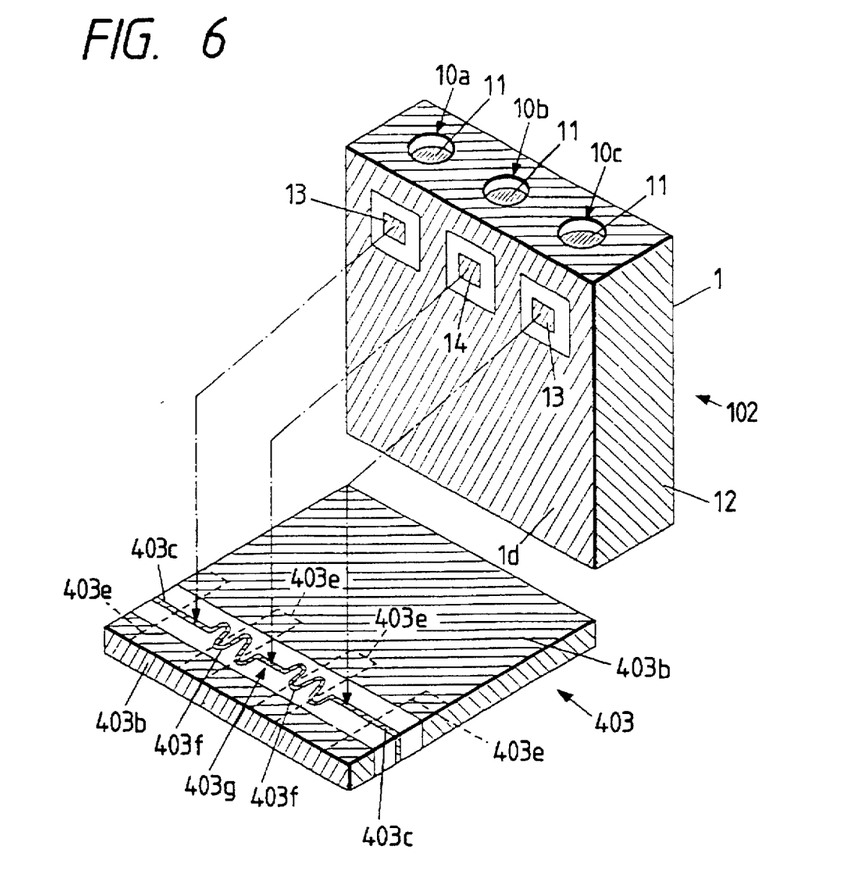
FIG. 6 is an exploded perspective view showing the configuration of a dielectric resonant component according to a third embodiment of the invention.

FIG. 6 is an exploded perspective view showing the construction of a dielectric resonant component according to a third embodiment of the invention. In FIG. 6, the dielectric resonant component of the embodiment comprises a dielectric multistage resonator 102 and a mount substrate 403 on which the dielectric multistage resonator 102 is mounted. The dielectric multistage resonator 102 includes a dielectric block 1 in which three inner conductor formation holes 10a to 10c are formed. The other configurational points of the dielectric multistage resonator 102 are the same as those of the dielectric multistage resonator 101 shown in FIG. 4. Corresponding elements are designated by like reference numerals, and their description is omitted.

On the mount substrate 403 which is made of a low-dielectric constant material, a grounding electrode 403b, a pair of input/output electrodes 403c, a pair of coil electrodes 403f, and a connecting electrode 403g are formed, respectively. The mount substrate 403 is mounted on the lower surface 1d of the dielectric multistage resonator 102. According to this configuration, the input/output electrodes 13 are connected to the input/output electrodes 403c, the signal extracting electrode 14 is connected to the connecting electrode 403g, and the outer conductor 12 is connected to the grounding electrode 403b. At predetermined positions on the upper surface of the mount substrate 403, resist films 403e are formed in order to prevent the input/output electrodes 403c and the coil electrodes 403f from being short-circuited to the outer conductor 12. The dielectric multistage resonator 102 is surface-mounted on a circuit board which is not shown, via the mount substrate 403.

Figure 7:
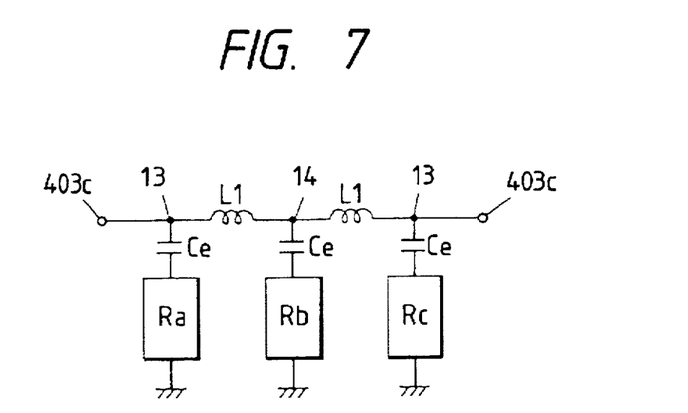
FIG. 7 is an equivalent circuit diagram of the dielectric resonant component shown in FIG. 6.

FIG. 7 is an equivalent circuit diagram of the dielectric resonant component shown in FIG. 6. In FIG. 7, inductances L1 due to the coil electrodes 403f are interposed between the dielectric resonator pairs Ra and Rb, and Rb and Rc, respectively. The dielectric resonators Ra and Rc and each of the input/output electrodes 13, and the dielectric resonator Rb and the signal extracting electrode 14 are coupled by external coupling capacitances Ce. The dielectric resonant component shown in FIG. 6 and having such an electrical configuration functions as a BEF (band elimination filter).

According to the embodiments shown in FIGS. 4 and 6, in the same manner as the embodiment shown in FIG. 1, the reliability can be enhanced and the characteristics can be improved. Moreover, the dielectric resonators can be coupled on the mount substrate in a desired manner, so that various electrical characteristics can be applied to the dielectric resonant component. Therefore, a dielectric resonant component with high functionality can be obtained.

The mount substrates 400 to 403 in the above-described embodiments have substantially the same size as that of the dielectric multistage resonators 100 to 102. Alternatively, the size of the mount substrates may be larger or smaller than that of the dielectric multistage resonators. Hereinafter, such embodiments will be described.

Figure 8:
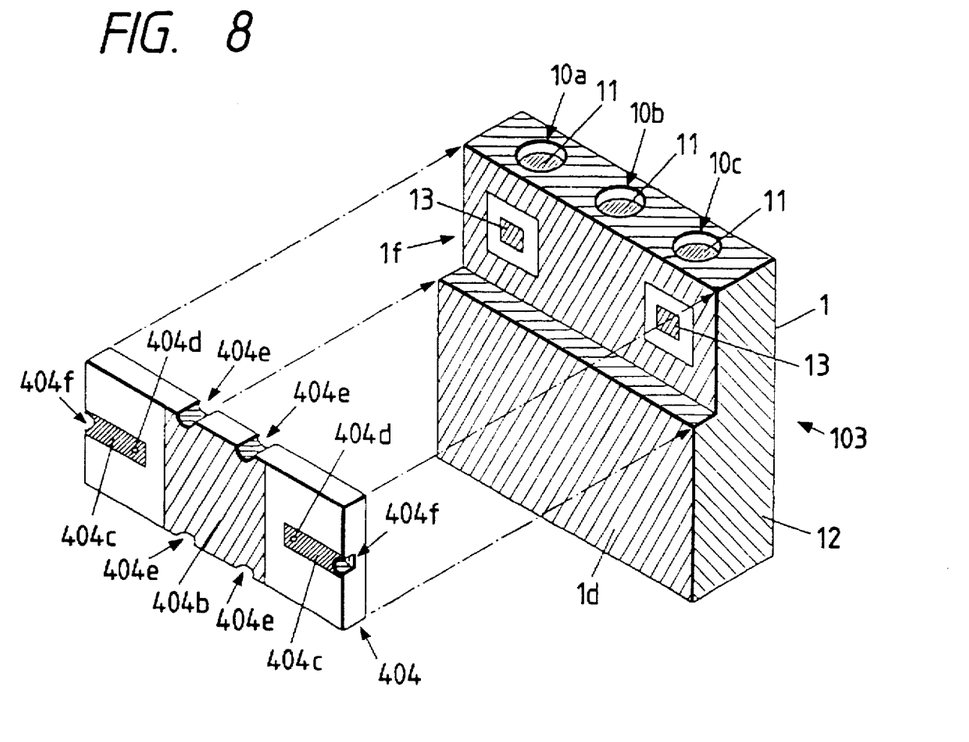
FIG. 8 is an exploded perspective view showing the configuration of a dielectric resonant component according to a fourth embodiment of the invention.

FIG. 8 is an exploded perspective view showing the configuration of a dielectric resonant component according to a fourth embodiment of the invention. In FIG. 8, the dielectric resonant component of the embodiment comprises a dielectric multistage resonator 103 and a mount substrate 404 on which the dielectric multistage resonator 103 is mounted. The dielectric multistage resonator 103 includes a dielectric block 1. On the lower surface 1d of the dielectric block 1, a step portion 1f for mounting the mount substrate 404 thereon is provided. The other configurational points of the dielectric multistage resonator 103 are the same as those of the dielectric multistage resonator 102 shown in FIG. 6. Corresponding elements are designated by like reference numerals, and their description is omitted.

Figure 9A:
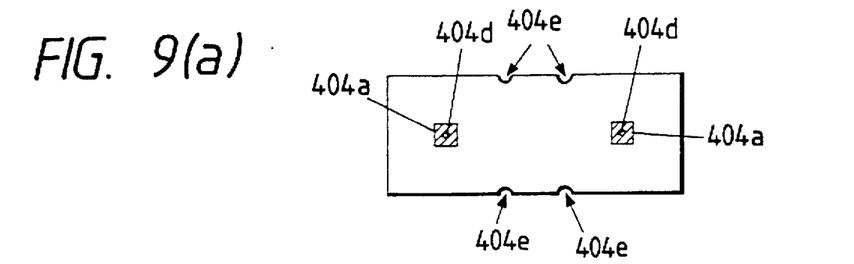
FIGS. 9(a) and 9(b) are diagram showing electrode patterns formed on an upper surface and intermediate layer of a mount substrate shown in FIG. 8, respectively.

The mount substrate 404 which is made of a low-dielectric constant material is selected to have a size which matches the step portion 1f of the dielectric block 1. As shown in FIG. 9(a), a pair of connecting electrodes 404a are formed on the upper surface of the mount substrate 404. In addition, as shown in FIG. 8, a pair of input/output electrodes 404c and a grounding electrode 404b are formed on the lower surface of the mount substrate 404. The connecting electrodes 404a are connected to the input/output electrodes 404c via through holes 404d. Recess portions 404e are formed on the front and rear side surfaces of the mount substrate 404. The grounding electrode 404b is formed also on the inner surface of each of the recess portions 404e. On the right and left side surfaces of the mount substrate 404, recess portions 404f are formed. The input/output electrodes 404c are formed also on the inner surfaces of the recess portions 404f.

Figure 9B:
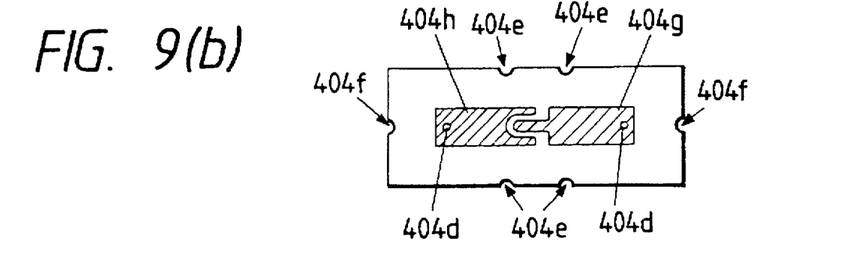

The mount substrate 404 has a multilayer structure. On an intermediate layer, an electrode pattern shown in FIG. 9(b) is formed. As shown in FIG. 9(b), the electrode pattern includes first and second capacitance electrodes 404g and 404h. One end of the first capacitance electrode 404g surfaces one end of the second capacitance electrode 404h so as to sandwich a dielectric (part of the mount substrate). The first capacitance electrode 404g and the second capacitance electrode 404h are connected to the connecting electrodes 404a and the input/output electrodes 404c via the through holes 404d.

The mount substrate 404 thus formed is mounted on and fixed to the step portion if of the dielectric multistage resonator 103. At this time, solder or the like is poured into the recess portions 404e, whereby the outer conductor 12 is surely connected to the grounding electrode 404b. In addition, the input/output electrodes 13 and the connecting electrodes 404a are connected to each other. The dielectric multistage resonator 103 is surface-mounted on a circuit board which is not shown, via the mount substrate 404.

Figure 10:
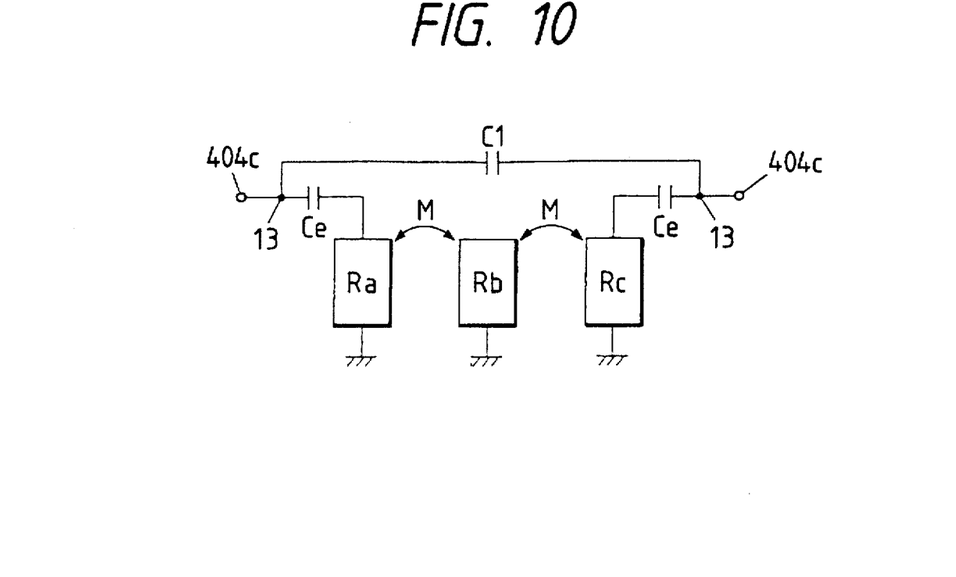
FIG. 10 is an equivalent circuit diagram of the dielectric resonant component shown in FIG. 9.

FIG. 10 is an equivalent circuit diagram of the dielectric resonant component shown in FIG. 8. In FIG. 10, the respective adjacent ones of the dielectric resonators Ra to Rc are inductively coupled to each other. The dielectric resonator Ra and Rc are coupled to the input/output electrodes 13 by external coupling capacitances Ce. In addition, a capacitance C1 which is produced by the first capacitance electrode 404g and the second capacitance electrode 404h is interposed between the input/output electrodes 13. The dielectric resonant component shown in FIG. 8 and having such an electrical configuration functions as a BPF.

Figure 11:
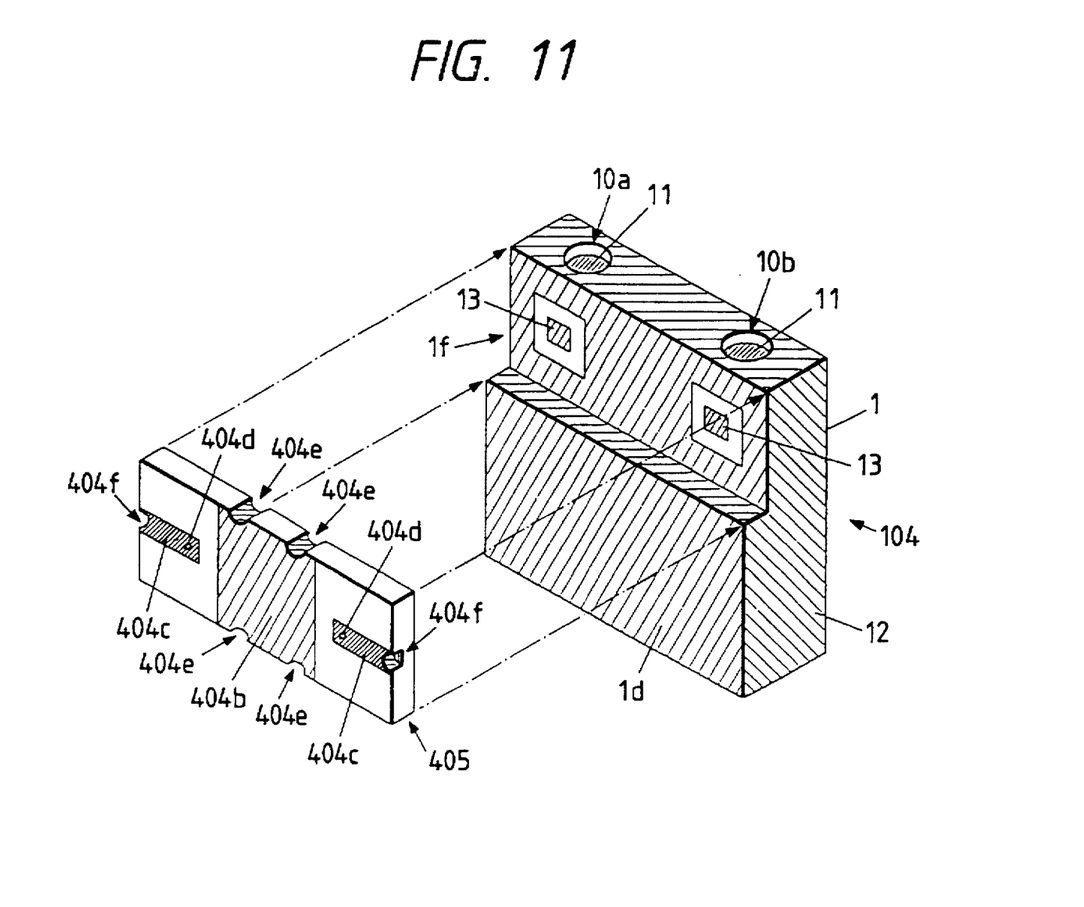
FIG. 11 is an exploded perspective view showing the construction of a dielectric resonant component according to a fifth embodiment of the invention.
Figure 12A:
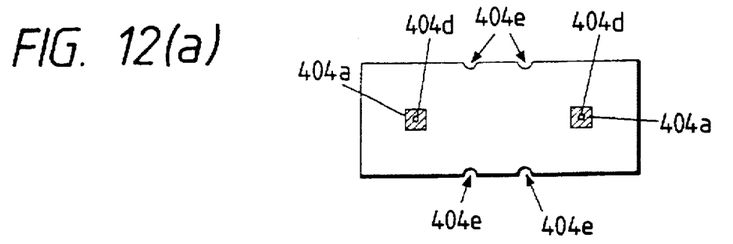
FIGS. 12(a) and 12(b) are diagrams showing electrode patterns formed on an upper surface and intermediate layer of a mount substrate shown in FIG. 11, respectively.
Figure 12B:
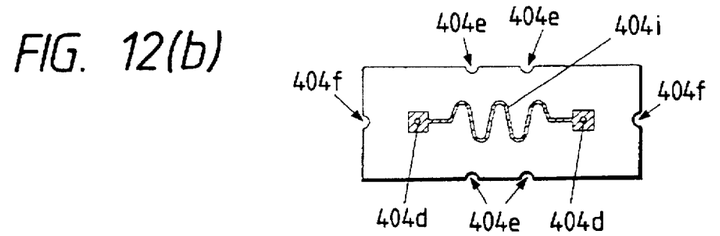

FIG. 11 is an exploded perspective view showing the construction of a dielectric resonant component according to a fifth embodiment of the invention. In FIG. 11, the dielectric resonant component of the embodiment comprises a dielectric multistage resonator 104 and a mount substrate 405 on which the dielectric multistage resonator 104 is mounted. The dielectric multistage resonator 104 has the same construction as that of the dielectric multistage resonator 103 shown in FIG. 8, except that the number of the inner conductor formation holes is two. The mount substrate 405 has a multilayer structure in the same manner as the mount substrate 404 shown in FIG. 8. Electrodes are formed on the upper and lower surfaces of the mount substrate 405 in the same manner as those on the mount substrate 404 shown in FIG. 8. On the intermediate layer, however, a coil electrode 404i is formed as shown in FIG. 12(b). The both ends of the coil electrode 404i are connected to the connecting electrodes 404a and the input/output electrodes 404c via through holes 404d. The mount substrate 405 having such a structure is mounted on a step portion 1f of the dielectric multistage resonator 104.

Figure 13:
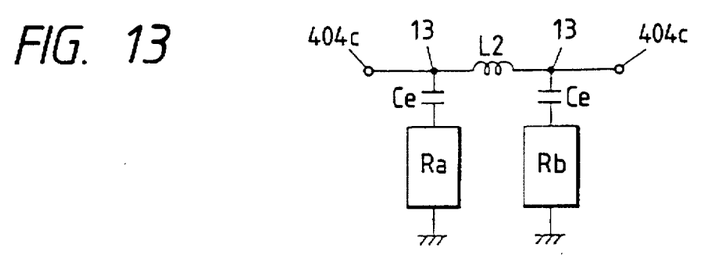
FIG. 13 is an equivalent circuit diagram of the dielectric resonant component shown in FIG. 11.

FIG. 13 is an equivalent circuit diagram of the dielectric resonant component shown in FIG. 11. In FIG. 13, the dielectric resonators Ra an d Rb are coupled to the input/output electrodes 13 by an external coupling capacitance Ce. An inductance L2 which is produced by the coil electrode 404i is interposed between the input/output electrodes 13. The dielectric resonant component shown in FIG. 11 and having such an electrical configuration functions as a BEF.

Figure 14:
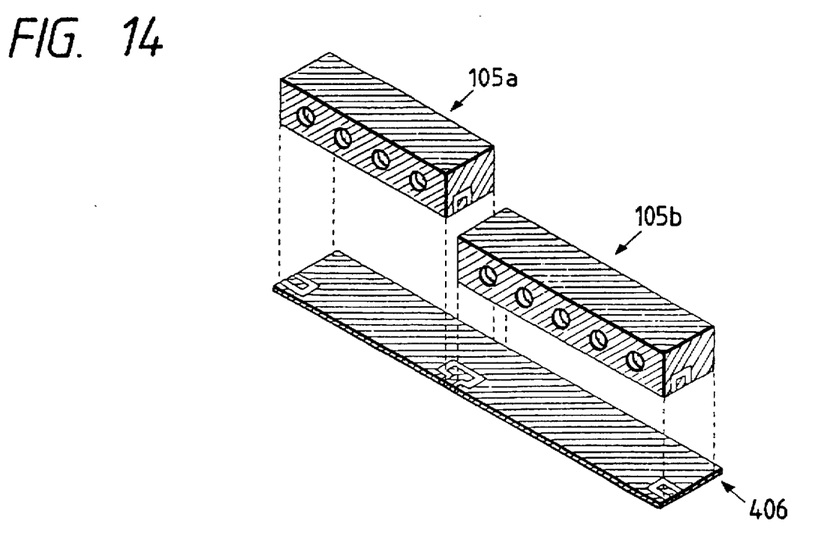
FIG. 14 is an exploded perspective view showing the configuration of a dielectric resonant component according to a sixth embodiment of the invention.
Figure 15:
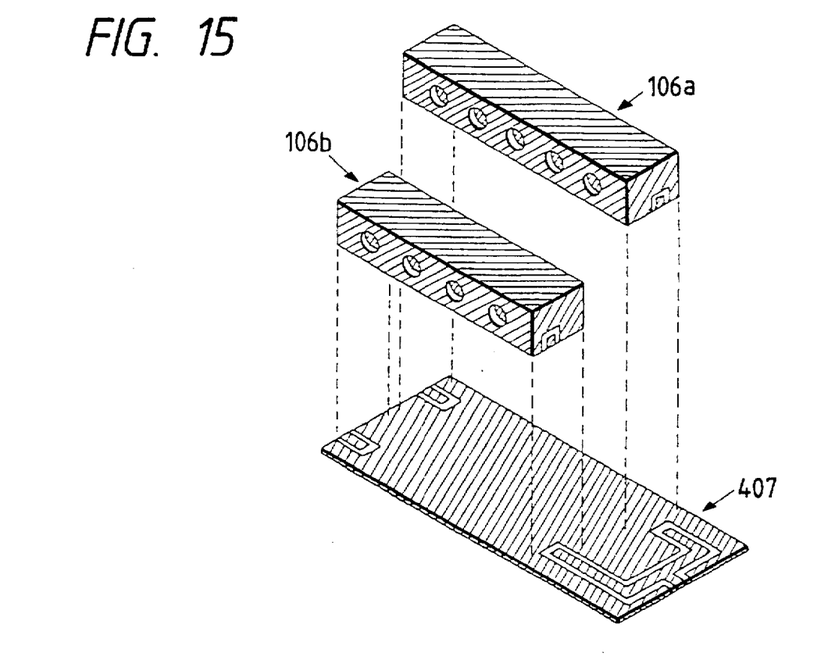
FIG. 15 is an exploded perspective view showing the construction of a dielectric resonant component according to a seventh embodiment of the invention.
Figure 16:
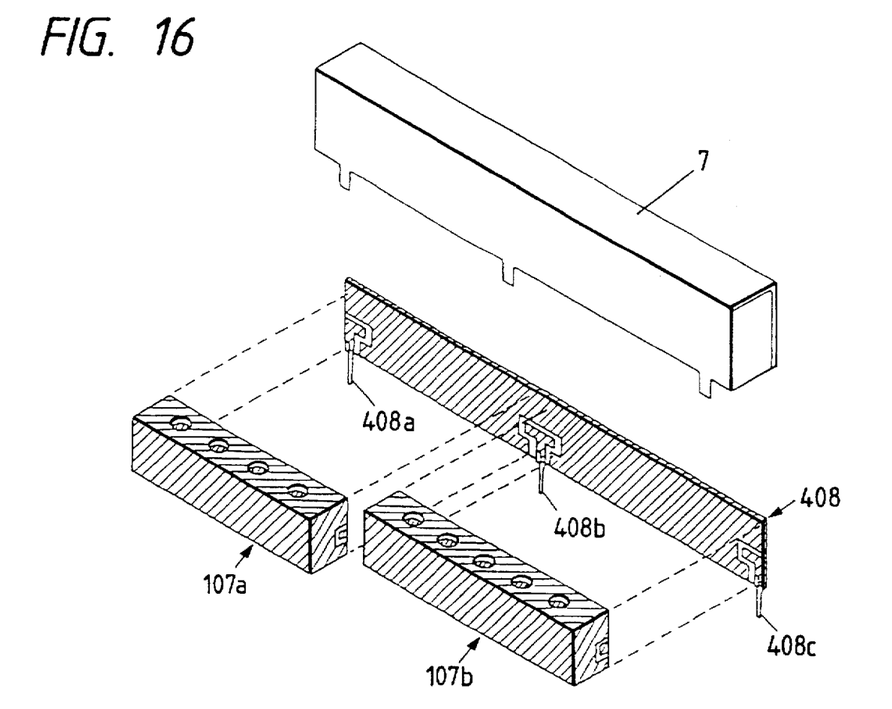
FIG. 16 is an exploded perspective view showing the configuration of a dielectric resonant component according to an eighth embodiment of the invention.

FIGS. 14 to 16 show the configurations of dielectric resonant components according to sixth to eighth embodiments of the invention, respectively. In the sixth to eighth embodiments, a plurality of dielectric multistage resonators are mounted on a single mount substrate and the dielectric resonators on the mount substrate are coupled in an adequate manner, thereby realizing a high-frequency device (a duplexer, a triplexer, or the like) having a further improved functionality.

FIG. 14 shows a series-type dielectric resonant component in which two dielectric multistage resonators 105a and 105b are arranged in series on a mount substrate 406. FIG. 15 shows a parallel-type dielectric resonant component in which two dielectric multistage resonators 106a and 106b are arranged in parallel on a mount substrate 407. Each of the dielectric resonant components shown in FIGS. 14 and 15 is surface-mounted on a circuit board (not shown) in such a manner that the mount substrates 406 and 407 are placed transversely, or horizontally.

As described above, each of the dielectric resonant components shown in FIGS. 14 and 15 is mounted transversely on a circuit board. By contrast, in the embodiment shown in FIG. 16, a dielectric resonant component is mounted on a circuit board vertically, or perpendicularly. That is, FIG. 16 shows a vertical-type dielectric resonant component. In FIG. 16, two dielectric multistage resonators 107a and 107b are mounted on a mount substrate 408. The mount substrate 408 is provided with IO terminals 408a to 408c which outwardly protrude from one side extending along the longitudinal direction. The IO terminals 408a to 408c are connected to input/output electrodes of the dielectric multistage resonators 107a and 107b. On the other hand, insertion holes into which the IO terminals 408a to 408c are to be inserted are formed on the circuit board which is not shown. The mount substrate 408 is set in a standing state as shown in FIG. 16, and the IO terminals 408a to 408c are inserted into the insertion holes of the circuit board, whereby the dielectric resonant component is mounted on the circuit board. Around the respective insertion holes of the circuit board, input/output electrodes are formed, so that, when the dielectric resonant component is mounted on the circuit board, the IO terminals 408a to 408c are connected to the input/output electrodes of the circuit board. The dielectric resonant component shown in FIG. 16 is covered with a case 7 which is preferably made of a metal. The case 7 prevents the electromagnetic field from leaking, and the mount substrate 408 from falling on the circuit board.

Figure 17:
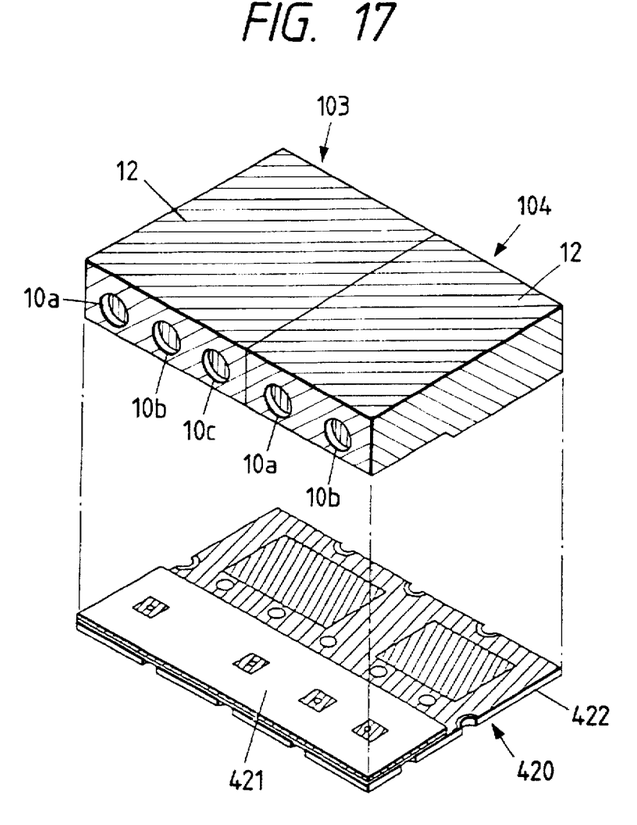
FIG. 17 is an exploded perspective view showing the configuration of a dielectric resonant component according to a ninth embodiment of the invention.
Figure 18:
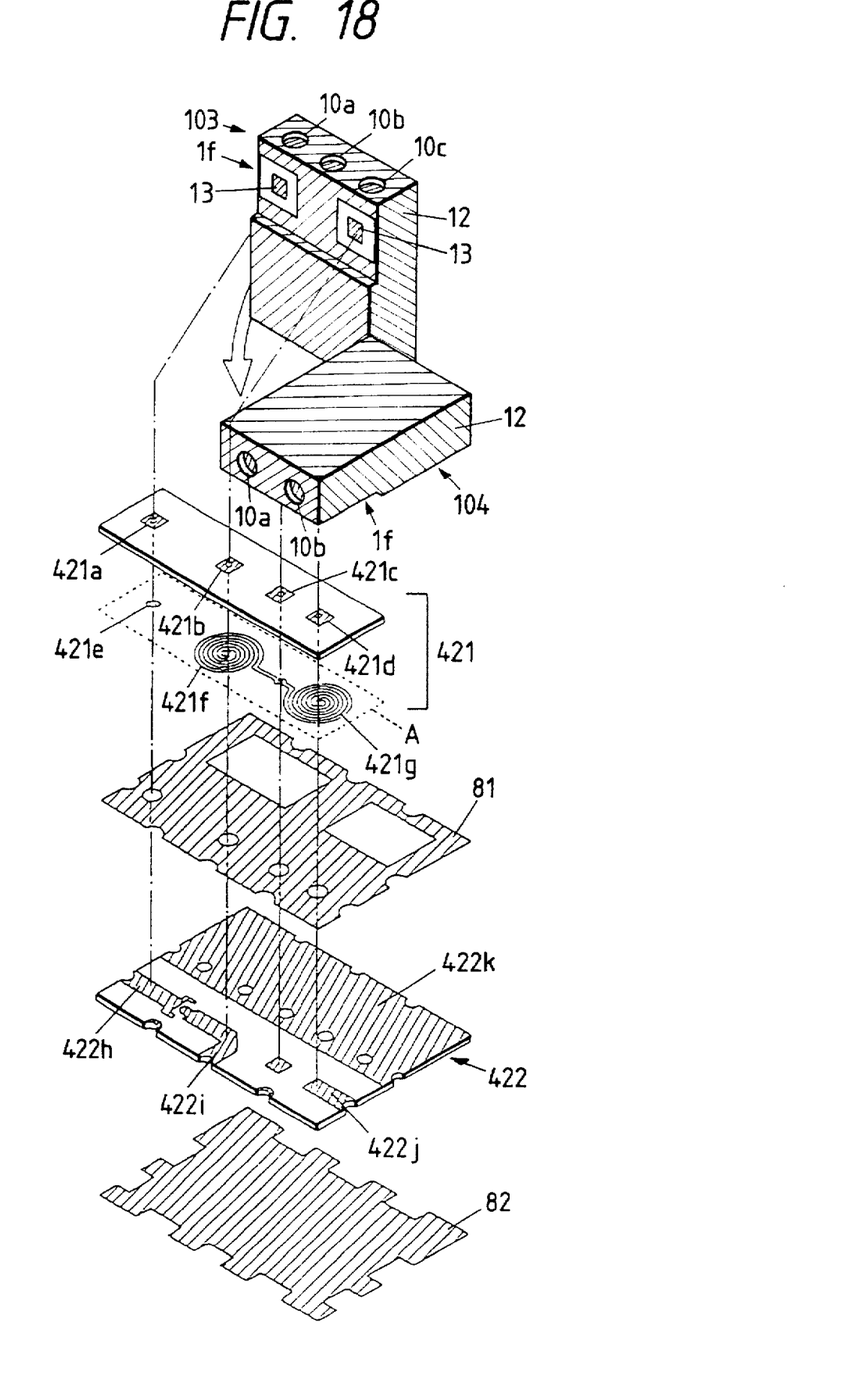
FIG. 18 is an exploded perspective view showing in greater detail the configuration of the dielectric resonant component of the ninth embodiment of the invention.

FIG. 17 is an exploded perspective view showing the configuration of a dielectric resonant component according to a ninth embodiment of the invention. FIG. 18 is an exploded perspective view showing in greater detail the configuration of the dielectric resonant component of FIG. 17. As shown in FIG. 17, the ninth embodiment comprises two dielectric multistage resonators 103 and 104, and one composite mount substrate 420. The composite mount substrate 420 is mounted on and fixed to the lower surfaces of the dielectric multistage resonators 103 and 104 which are arranged in parallel. The dielectric multistage resonators 103 and 104 used in the embodiment are constructed in the same manner as the dielectric multistage resonators 103 and 104 shown in FIGS. 8 and 11, respectively. The composite mount substrate 420 has a structure in which first and second mount substrates 421 and 422 are bonded and fixed to each other. As shown in FIG. 18, the first mount substrate 421 is formed so as to be fitted into the step portions 1f of the dielectric multistage resonators 103 and 104. The second mount substrate 422 is formed to have the same size as the total of the lower surfaces of the dielectric multistage resonators 103 and 104.

On the upper surface of the first mount substrate 421, connecting electrodes 421a and 421b are formed and connected to the input/output electrodes 13 of the dielectric multistage resonator 103, and connecting electrodes 421c and 421d which are connected to the input/output electrodes (not shown) of the dielectric multistage resonator 104. On the lower surface of the first mount substrate 421, a connecting electrode 421e, a first coil electrode 421f, and a second coil electrode 421g are formed, as shown in a simulation manner in an area defined by a broken line A. The connecting electrode 421e is connected to the connecting electrode 421a on the upper surface via a through hole. One end of the first coil electrode 421f is connected to the connecting electrode 421b on the upper surface via a through hole, and the other end of the electrode is connected to the connecting electrode 421c on the upper surface via a through hole. One end of the second coil electrode 421g is connected to the connecting electrode 421d on the upper surface via a through hole, and the other end of the electrode is connected to the connecting electrode 421c on the upper surface via a through hole.

Figure 19:
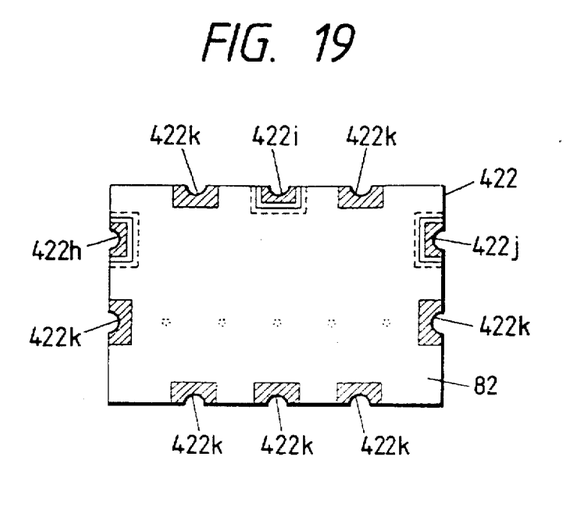
FIG. 19 is a bottom view of a multiple mount substrate shown in FIG. 17.

On the other hand, on the upper surface of the second mount substrate 422, a first input/output electrode 422h, an antenna connecting electrode 422i, a second input/output electrode 422j, and a grounding electrode 422k are formed. The first input/output electrode 422h is connected to the connecting electrode 421e on the lower surface of the first mount substrate 421. The antenna connecting electrode 422i is connected to the one end of the first coil electrode 421f. The second input/output electrode 422j is connected to the one end of the second coil electrode 421g. The grounding electrode 422k is connected to the outer conductor 12 of each of the dielectric multistage resonators. The first input/output electrode 422h and the antenna connecting electrode 422i are located close to each other on the upper surface of the second mount substrate 422, whereby a predetermined coupling capacitance is formed. On the upper surface of the second mount substrate 422, a first resist film 81 is formed in order to prevent the electrodes on the upper surface of the second mount substrate 422 from being needlessly in contact with the electrodes on the lower surface of the first mount substrate 421. Similarly, on the lower surface of the second mount substrate 422, a second resist film 82 is formed in order to prevent the electrodes on the lower surface of the second mount substrate 422 from being needlessly in contact with electrodes on the circuit board. In order clarify the structure, the lower surface of the second mount substrate 422 on which the second resist film 82 is formed is shown in FIG. 19.

Figure 20:
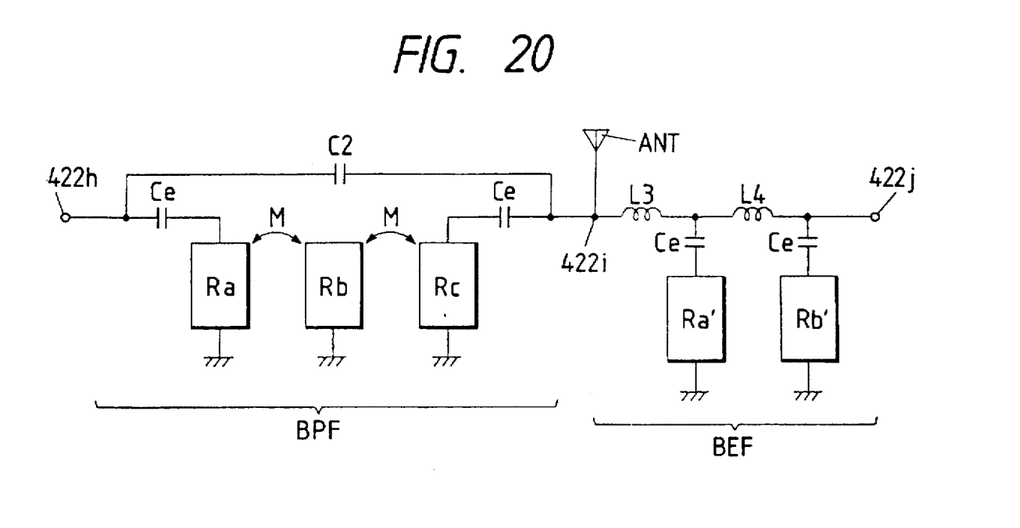
FIG. 20 is an equivalent circuit diagram of the dielectric resonant component shown in FIGS. 17 and 18.

FIG. 20 is an equivalent circuit diagram of the dielectric resonant component shown in FIGS. 17 and 18. As shown in FIG. 20, dielectric resonators Ra to Rc in the dielectric multistage resonator 103 cooperate with a coupling capacitance C2 (a capacitance caused between the first input/output electrode 422h and the antenna connecting electrode 422i), thereby constituting a BPF. In contrast, dielectric resonators Ra' and Rb' in the dielectric multistage resonator 104 cooperate with an inductance L3 caused by the first coil electrode 421f and an inductance L4 caused by the second coil electrode 421g, thereby constituting a BEF. An antenna ANT is connected to the antenna connecting electrode 422i. With such an electrical configuration, the dielectric resonant component shown in FIGS. 17 and 18 functions as a duplexer.

As described above, according to the invention, only the dielectric block is covered with the outer conductor, and the outer conductor is not formed on the mount substrate. Therefore, there is no possibility that a crack occurs in the outer conductor at the junction of the dielectric block and the mount substrate. As a result, the characteristics are stabilized and the reliability is enhanced as compared with a conventional dielectric resonant component. In addition, the mount substrate in the invention does not constitute part of the dielectric multistage resonator, unlike a dielectric substrate in a conventional dielectric resonant component. Accordingly, an effect on the characteristics which is caused by any variation in the gap between the dielectric multistage resonator and the mount substrate is very small. Therefore, the invention can provide a dielectric resonant component with excellent characteristics. Moreover, the outer conductor is formed on a surface of the dielectric block to which the mount substrate is mounted, so that the adhesive strength can be increased as compared with the conventional case where dielectrics are directly adhered to each other.

Also, according to the invention, the input/output electrodes on the dielectric multistage resonator can be connected to input/output electrodes on a circuit board which are arranged at an interval different from that of the input/output electrodes on the dielectric multistage resonator. Therefore, even if the interval of the input/output electrodes on the dielectric multistage resonator is different from that of input/output electrodes on a circuit board, the dielectric resonant component can be mounted on the circuit board. As a result, it is unnecessary for a user to change the design of the circuit board depending on the type of a dielectric resonant component to be employed, so that the labor and the product cost can be reduced.

Further, according to the invention, the dielectric resonators of the dielectric multistage resonator are coupled to each other on the mount substrate in a predetermined manner, whereby a dielectric resonant component with a reduced size and high functionality can be obtained.

Still further, according to the invention, the mount substrate is mounted on and fixed to the step portion formed on the dielectric block, whereby a dielectric resonant component with a further reduced size can be obtained.

Still further, according to the invention, a plurality of dielectric multistage resonators are mounted on a single mount substrate, whereby a dielectric resonant component with higher functionality can be obtained.

What is claimed is:

1. A dielectric resonator apparatus, comprising:

a dielectric resonator component including one dielectric block, at least one inner conductor formation hole located in said one dielectric block, an inner conductor located on an inner surface of said at least one inner conductor formation hole, and an outer conductor substantially covering an entire outer surface of said one dielectric block, and a pair of input/output electrodes; and a mount substrate for being fixedly mounted on said dielectric resonator component for transmitting a signal between said dielectric resonator component and an external circuit board, when said dielectric resonant component is mounted on said external circuit board;

wherein said dielectric resonator component further comprises a pair of signal extracting electrodes, and said mount substrate further comprises at least one bypass electrode for being connected to said signal extracting electrodes; and wherein said mount substrate comprises at least one resist film for preventing said at least one bypass electrode of said mount substrate from being short-circuited to said outer conductor of said dielectric resonator component.

2. A dielectric resonator apparatus according to claim 1, wherein said mount substrate further comprises:

a pair of input/output electrodes for connecting said input/output electrodes of said dielectric resonator component to said external circuit board, and at least one additional resist film for preventing said mount substrate input/output electrodes from being short-circuited to said outer conductor of said dielectric resonator component.

3. A dielectric resonator apparatus according to claim 1, wherein said pair of signal extracting electrodes and said pair of input/output electrodes are on a common face of said dielectric block; and said mount substrate has a pair of input/output electrodes for connecting said input/output electrodes of said dielectric component to said external circuit board;

said input/output electrodes and said bypass electrode being on a common face of said mount substrate;

said respective common faces of said dielectric block and said mount substrate being fixed together, said respective input/output electrodes of said dielectric block and said mount substrate being in contact with each other, and said signal extracting electrodes on said dielectric block being in contact with said bypass electrode on said mount substrate.

4. A dielectric resonator apparatus, comprising:

a dielectric resonator component including one dielectric block, at least one inner conductor formation hole located in said one dielectric block, an inner conductor located on an inner surface of said at least one inner conductor formation hole to form a dielectric resonator, an outer conductor substantially covering an entire outer surface of said one dielectric block, at least one signal extracting electrode, and a pair of input/output electrodes; and a mount substrate for being fixedly mounted on said dielectric resonator component for transmitting a signal between said dielectric resonator component and an external circuit board, when said dielectric resonant component is mounted on said external circuit board, and comprising at least one electrode pattern for being connected to said at least one signal extracting electrode; and further comprising at least one-resist film for preventing said at least one electrode pattern on said mount substrate from being short-circuited to said outer conductor of said at least one dielectric resonator component.

5. A dielectric resonator apparatus according to claim 4, wherein said dielectric block has a pair of dielectric resonators corresponding respectively to said input/output electrodes, and a third dielectric resonator corresponding to said at least one signal extracting electrode.

6. A dielectric resonator apparatus according to claim 5, wherein said electrode pattern on said mount substrate interconnects said input/output electrodes.

7. A dielectric resonator apparatus according to claim 6, wherein said electrode pattern further comprises a reactive component.

8. A dielectric resonator apparatus according to claim 7, wherein said reactive component comprises an inductor.

9. A dielectric resonator apparatus according to claim 8, further comprising at least one resist film for preventing said inductor from being short-circuited to said outer conductor.

10. A dielectric resonator apparatus according to claim 7, wherein said reactive component comprises a pair of inductors each interconnecting said signal extracting electrode with a respective one of said input/output electrodes.

11. A dielectric resonator apparatus according to claim 10, further comprising at least one resist film for preventing said pair of inductors from being short-circuited to said outer conductor.

12. A dielectric resonator apparatus according to claim 4 wherein said electrode pattern further comprises a reactive component.

13. A dielectric resonator apparatus according to claim 12, wherein said electrode pattern on said mount substrate interconnects said input/output electrodes.

14. A dielectric resonator apparatus according to claim 12, wherein said reactive component comprises an inductor.

15. A dielectric resonator apparatus according to claim 14, further comprising at least one resist film for preventing said inductor from being short-circuited to said outer conductor.

16. A dielectric resonator apparatus according to claim 12, wherein said reactive component comprises a pair of inductors each interconnecting said signal extracting electrode with a respective one of said input/output electrodes.

17. A dielectric resonator apparatus according to claim 16, further comprising at least one resist film for preventing said pair of inductors from being short-circuited to said outer conductor.

18. A dielectric resonator apparatus according to claim 4, wherein said dielectric block has a pair of dielectric resonators corresponding respectively to said input/output electrodes, and third and fourth dielectric resonators corresponding respectively to a pair of said signal extracting electrodes.

19. A dielectric resonator apparatus according to claim 18, wherein said electrode pattern on said mount substrate interconnects said pair of signal extracting electrodes.

20. A dielectric resonator apparatus according to claim 4, further comprising:

a pair of input/output electrodes for connecting said input/output electrodes of said dielectric resonator component to said external circuit board, and at least one additional resist film for preventing said mount substrate input/output electrodes from being short-circuited to said outer conductor of said dielectric resonator component.

21. A dielectric resonator apparatus according to claim 4, wherein said pair of signal extracting electrodes and said pair of input/output electrodes are on a common face of said dielectric block; and said mount substrate has a pair of input/output electrodes for connecting said input/output electrodes of said dielectric component to said external circuit board;

said input/output electrodes and said electrode pattern being on a common face of said mount substrate;

said respective common faces of said dielectric block and said mount substrate being fixed together with said respective input/output electrodes of said dielectric block and said mount substrate being in contact with each other, and with said signal extracting electrodes on said dielectric block being in contact with said electrode pattern on said mount substrate.

22. A dielectric resonator apparatus according to claim 4, wherein said at least one resist film is on said mount substrate.

* * * * *